(12) United States Patent
Deguenther et al.

(10) Patent No.: US 8,854,604 B2
(45) Date of Patent: Oct. 7, 2014

(54) MICROLITHOGRAPHIC PROJECTION EXPOSURE APPARATUS

(75) Inventors: Markus Deguenther, Aalen (DE); Michael Patra, Oberkochen (DE); Andras G. Major, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 605 days.

(21) Appl. No.: 13/215,616

(22) Filed: Aug. 23, 2011

(65) Prior Publication Data

US 2012/0002185 A1 Jan. 5, 2012

Related U.S. Application Data

(63) Continuation of application No. PCT/EP2009/001827, filed on Mar. 13, 2009.

(51) Int. Cl.
| | |
|---|---|
| *G03B 27/54* | (2006.01) |
| *G03B 27/42* | (2006.01) |
| *G03F 7/20* | (2006.01) |
| *G02B 26/08* | (2006.01) |

(52) U.S. Cl.
CPC .......... *G03F 7/7085* (2013.01); *G03F 7/70591* (2013.01); *G03F 7/70116* (2013.01); *G03F 7/70266* (2013.01); *G02B 26/0833* (2013.01); *G03F 7/706* (2013.01)
USPC ............................................. 355/67; 355/53

(58) Field of Classification Search
CPC . G03F 7/702; G03F 7/70116; G03F 7/70591; G03F 7/70266; G02B 26/0833
USPC .................... 355/53, 67; 356/233.7, 399–401
See application file for complete search history.

(56) References Cited

U.S. PATENT DOCUMENTS

| | | | |
|---|---|---|---|
| 5,191,200 A * | 3/1993 | van der Werf et al. | ..... 250/201.4 |
| 7,061,582 B2 | 6/2006 | Zinn et al. | |
| 7,548,302 B2 * | 6/2009 | Bleeker et al. | .................. 355/67 |

(Continued)

FOREIGN PATENT DOCUMENTS

| | | |
|---|---|---|
| DE | 10 2008 050 446.7 | 4/2010 |
| EP | 1 262 836 A1 | 12/2002 |

(Continued)

OTHER PUBLICATIONS

International Search Report for the corresponding PCT Application No. PCT/EP09/001827, mailed Nov. 23, 2009.

(Continued)

*Primary Examiner* — Hung Henry Nguyen
(74) *Attorney, Agent, or Firm* — Fish & Richardson P.C.

(57) ABSTRACT

A microlithographic projection exposure apparatus includes an optical surface, which may be formed by a plurality of micro-mirrors, and a measurement device which is configured to measure a parameter related to the optical surface at a plurality of locations. The measurement device includes an illumination unit with a plurality of illumination members, each having a light exit facet. An optical imaging system establishes an imaging relationship between an object plane in which at least two light exit facets are arranged, and an image plane which at least substantially coincides with the optical surface. A detector unit measures the property of measuring light after it has interacted with the optical surface, and an evaluation unit determines the surface related parameter for each of the locations on the basis of the properties determined by the detector unit.

22 Claims, 10 Drawing Sheets

(56) References Cited

U.S. PATENT DOCUMENTS

| | | |
|---|---|---|
| 2002/0015158 A1* | 2/2002 | Shiode et al. .............. 356/614 |
| 2004/0036977 A1 | 2/2004 | Tanaka et al. |
| 2005/0018294 A1 | 1/2005 | Hauschild |
| 2006/0087634 A1 | 4/2006 | Brown et al. |
| 2006/0103827 A1 | 5/2006 | Derksen |
| 2011/0188017 A1 | 8/2011 | Horn et al. |

FOREIGN PATENT DOCUMENTS

| | | |
|---|---|---|
| JP | 2004-056125 | 2/2004 |
| JP | 2006-148107 | 6/2006 |
| WO | WO 2005/026843 A2 | 3/2005 |
| WO | WO 2005/078522 A | 8/2005 |
| WO | WO 2008/095695 A2 | 8/2008 |
| WO | WO 2009/015845 | 2/2009 |
| WO | WO 2009/080310 | 7/2009 |

OTHER PUBLICATIONS

Japanese office action, with translation thereof, for corresponding JP Appl No. 2011-553289, dated May 24, 2013.

* cited by examiner

MICROLITHOGRAPHIC PROJECTION EXPOSURE APPARATUS

CROSS-REFERENCE TO RELATED APPLICATION

This application is a continuation of, and claims benefit under 35 USC 120 to, international application PCT/EP2009/001827, filed Mar. 13, 2009, which is hereby incorporated by reference in its entirety.

FIELD

The disclosure generally relates to microlithographic exposure apparatus that image a mask onto a light sensitive surface, and in particular to such apparatus including an optical surface, for example a mirror or a mirror array, and a measurement device which is configured to measure a parameter related to the optical surface at a plurality of locations.

BACKGROUND

Microlithography (also called photolithography or simply lithography) is a technology for the fabrication of integrated circuits, liquid crystal displays and other microstructured devices. The process of microlithography, in conjunction with the process of etching, is used to pattern features in thin film stacks that have been formed on a substrate, for example a silicon wafer. At each layer of the fabrication, the wafer is first coated with a photoresist which is a material that is sensitive to radiation, such as deep ultraviolet (DUV) or extreme ultraviolet (EUV) light. Next, the wafer with the photoresist on top is exposed to projection light in a projection exposure apparatus. The apparatus projects a mask containing a pattern onto the photoresist so that the latter is only exposed at certain locations which are determined by the mask pattern. After the exposure the photoresist is developed to produce an image corresponding to the mask pattern. Then an etch process transfers the pattern into the thin film stacks on the wafer. Finally, the photoresist is removed. Repetition of this process with different masks results in a multi-layered micro-structured component.

A projection exposure apparatus typically includes an illumination system for illuminating the mask, a mask stage for aligning the mask, a projection objective and a wafer alignment stage for aligning the wafer coated with the photoresist. The illumination system illuminates a field on the mask that may have the shape of a rectangular or curved slit, for example.

In current projection exposure apparatus a distinction can be made between two different types of apparatus. In one type each target portion on the wafer is irradiated by exposing the entire mask pattern onto the target portion in one go. Such an apparatus is commonly referred to as a wafer stepper. In the other type of apparatus, which is commonly referred to as a step-and-scan apparatus or scanner, each target portion is irradiated by progressively scanning the mask pattern under the projection beam along a scan direction while synchronously moving the substrate parallel or anti-parallel to this direction. The ratio of the velocity of the wafer and the velocity of the mask is equal to the magnification of the projection objective, which is usually smaller than 1, for example 1:4.

It is to be understood that the term "mask" (or reticle) is to be interpreted broadly as a patterning mechanism. Commonly used masks contain transparent or reflective patterns and may be of the binary, alternating phase-shift, attenuated phase-shift or various hybrid mask type, for example. However, there are also active masks, e.g. masks realized as a programmable mirror array. Also programmable LCD arrays may be used as active masks.

Ideally, the illumination system illuminates each point of the illuminated field on the mask with projection light having a well defined irradiance and angular distribution. The term angular distribution describes how the total light energy of a light bundle, which converges towards a particular point in the mask plane, is distributed among the various directions of the rays that constitute the light bundle.

The angular distribution of the projection light impinging on the mask is usually adapted to the kind of pattern to be projected onto the photoresist. For example, relatively large sized features may involve a different angular distribution than small sized features. The most commonly used angular distributions of projection light are referred to as conventional, annular, dipole and quadrupole illumination settings. These terms refer to the irradiance distribution in a system pupil surface of the illumination system. With an annular illumination setting, for example, only an annular region is illuminated in the system pupil surface. Thus there is only a small range of angles present in the angular distribution of the projection light, and thus all light rays impinge obliquely with similar angles onto the mask.

Different approaches are known in the art to modify the angular distribution of the projection light in the mask plane so as to achieve the desired illumination setting. For achieving maximum flexibility in producing different angular distribution in the mask plane, it has been proposed to use mirror arrays that illuminate the pupil surface.

In EP 1 262 836 A1 the mirror array is realized as a microelectromechanical system (MEMS) including more than 1000 microscopic mirrors. Each of the mirrors can be tilted about two orthogonal tilt axes. Thus radiation incident on such a mirror device can be reflected into almost any desired direction of a hemisphere. A condenser lens arranged between the mirror array and the pupil surface translates the reflection angles produced by the mirrors into locations in the pupil surface. This known illumination system makes it possible to illuminate the pupil surface with a plurality of spots, wherein each spot is associated with one particular microscopic mirror and is freely movable across the pupil surface by tilting this mirror.

Similar illumination systems are known from US 2006/0087634 A1, U.S. Pat. No. 7,061,582 B2 and WO 2005/026843 A2. Such arrays of tiltable mirrors have also been proposed for EUV illumination systems.

In general, the orientation of the individual mirrors are desirably controlled with great accuracy and at high speed. To this end it has been proposed to use a closed-loop control. Such a control scheme can involve monitoring the orientation of each mirror with a high repetition frequency.

International application WO 2008/095695 A1 discloses a measurement device which makes it possible to measure the orientation of each individual mirror. To this end an illumination unit is provided which produces for each mirror an individual measuring light bundle. A detector measures the angle of the light bundles after they have been reflected from the mirrors. If the direction of the light bundles impinging on the mirrors is known, the orientation of the mirrors can be determined by an evaluation unit on the basis of the measured directions of the reflected light bundles. By using time or frequency multiplexing it is possible to determine the orientation of the mirrors sequentially or even in one go.

The illumination unit uses an array of laser diodes, in particular vertical cavity surface emitting lasers (VCSEL), as light sources producing the measuring light bundles that are directed on the mirrors. For each laser diode an imaging lens is provided that is arranged in front of the laser diode and images the light exit facet of the diode on one of the mirrors. The imaging lenses preferably form a microlens array having the same pitch as the laser diodes.

However, it has turned out that under the most preferred dimensions of such measurement devices the measurement accuracy is often not satisfactory.

The same issue is also encountered in similar measurements within the field of microlithographic projection exposure apparatus. For example, in the projection objectives of such apparatus there are sometimes optical elements having an optical surface which can be deformed for correcting aberrations. Deformations of the optical surface may be accomplished with the help of actuators exerting mechanical forces, or by directing radiation on certain areas on the optical surface. For controlling the actuators the shape of the optical surface can be measured using a measurement device which is configured to measure a parameter related to the optical surface at a plurality of locations. Since it does not really matter whether the optical surface is continuous or discontinuous, as is the case with a mirror array, the measurement accuracy is sometimes not satisfactory in such cases, too.

SUMMARY

The disclosure provides a microlithographic projection exposure apparatus including an optical surface and a measurement device, in which the measurement measures a surface related parameter at a plurality of locations with improved accuracy.

In one aspect, a microlithographic projection exposure apparatus includes a measurement device with an illumination unit having a plurality of illumination members. Each illumination member has a light exit facet which is configured to emit measuring light. The illumination unit further includes an optical imaging system which establishes an imaging relationship between an object plane in which at least two light exit facets are arranged, and an image plane which at least substantially coincides with the optical surface, thereby producing on the optical surface a plurality of measuring light spots being images of the at least two light exit facets. The measurement device further includes a detector unit which is configured to measure a property of measuring light after it has interacted with the optical surface at the measuring light spots. An evaluation unit is configured to determine the surface related parameter for each of the locations on the basis of the properties of the measuring light determined by the detector unit.

The inventors have perceived that if an array of imaging lenses is used to image illumination members on the optical surface, as has been proposed in the prior art, diffraction effects may become noticeable. Diffraction may cause (at least for preferred dimensions of the illumination members, the locations on the optical surface and the distance in between) the measuring light spots to be blurred and to be unrestricted to the desired locations (instead extending to adjacent locations). If measuring light impinges on an adjacent location, this has a detrimental effect on the measurement accuracy.

In contrast to such prior art solutions, the disclosure proposes to arrange at least two light exit facets of illumination members in a common object plane of an optical imaging system. Since this imaging system provides a larger object plane in which at least two, and preferably all, light exit facets are arranged, the diameters of the optical elements contained in the optical imaging system will be so large that diffraction, which tends to reduce the resolution, can be neglected. Consequently, the measuring light spots are not substantially blurred by diffraction patterns. A reduction of the measurement accuracy as a result of blurred measuring light spots is thus avoided. In cases where an overlap of measuring light spots is admitted, the disclosure may be used to increase the density of measuring light spots, which also increases the measurement accuracy.

It is to be understood that the terms "object plane" or "image plane" do not necessarily imply that these planes are perfectly planar. Curved planes may be useful in some applications, for example for measuring a curved surface of an imaging mirror in a EUV projection objective.

In some embodiments, the parameter related to the optical surface and measured at a plurality of locations defines the shape of the optical surface. This is particularly useful because it makes it possible to measure the shape of the optical surface in a contact-free manner with a high accuracy. The term "shape" as used in the present application may also include the orientation of the optical surface. The parameter related to the optical surface may also be the transmittance or the reflectance of the optical surface, for example. The parameter may also be the refractive index of an optical material having an interface forming the optical surface. The disclosure is thus not restricted to surface shape measurement devices.

A shape measurement of the optical surface is particularly useful if the apparatus includes a surface deformation unit which is configured to deform the optical surface. Such deformations may be produced to reduce wavefront errors in optical systems, in particular in the projection objective of the projection exposure apparatus. The surface deformation unit may include actuators configured to produce forces which act upon the optical surface, for example in order to bend the optical element including the optical surface. The surface deformation unit may also include heating light sources which direct light towards selected areas on the optical surface. Absorption of heating light then causes a deformation of the optical surface. The measurement device may then form part of a closed-loop control and monitor the surface deformation produced by the surface deformation unit.

In some embodiments, the optical surface is configured such that it reflects at least a substantial portion of the measuring light. For example, the optical surface may be formed by an adaptive mirror which is used in the projection exposure apparatus to correct aberrations. However, the optical surface may also be formed on a refractive optical element such as a lens. In this case the (albeit small) fraction of light reflected from the optical surface may suffice to measure the surface related property. In a preferred embodiment the optical surface is configured such that it reflects more than 10%, preferably more than 50%, of the measuring light. The interaction of the measuring light with the optical surface does not necessarily have to be a reflection, but may also be a refraction. In this case a property not of the reflected, but of the transmitted portion of measuring light is measured.

In certain embodiments, the optical surface is formed by an array of mirrors that are adapted to reflect an impinging light ray by a reflection angle that is variable in response to a control signal. This may be achieved by deforming the mirror surfaces, or more easily by providing mirrors that are configured to be tilted about at least one tilt axis.

Such an array of mirrors may be arranged in an illumination system of the apparatus. The mirrors then direct projection light towards a system pupil surface of the illumination system. This makes it possible to flexibly vary the angular light distribution (illumination setting) of the light impinging on the mask.

The disclosure is particularly useful in cases where the condition $p_s^2 < 5\lambda d$. Here d is an average distance between the light exit facets and the optical surface, $p_s$ is an average pitch of the light spots produced on the optical surface, and $\lambda$ is a center wavelength of the measuring light. Under such conditions the effect of diffraction would be quite significant, and thus the disclosure, which reduces adverse effects caused by diffraction, can be used most advantageously.

In some embodiments, at least one illumination member includes a measuring light source adapted to produce measuring light. A light concentrator is arranged in an optical path of the measuring light such that it reduced the divergence of the measuring light produced by the measuring light source. The light concentrator may be formed by a positive lens or lens arrangement, diffractive elements or a GRIN lens directly applied on the measuring light source. A light concentrator is advantageous because it makes it possible to reduce the size and complexity of the imaging system which images the light exit facets, now formed by a back surface of the light concentrator, on the optical surface. This is because the measuring light emerging from exit facets of the light concentrator has a smaller divergence, and thus the geometrical optical flux the imaging system has to cope with is reduced.

A light concentrator also makes it possible to have at least one illumination member which includes at least two measuring light sources directing measuring light to the same light spot on the optical surface. The illumination member then still has a single light exit facet which can, however, be illuminated by at least two measuring light sources. In certain embodiments, the at least two measuring light sources are arranged in a back focal plane of the light concentrator. This concept may be used to provide redundancy in case of failure of a light source.

The advantage of avoiding adverse diffractive effects does not require that all light exit facets contained in the illumination unit have to be imaged by one single imaging system on the optical surface. In some cases it may be advantageous to subdivide the imaging system to at least two imaging subsystems, wherein each imaging subsystem has an object plane in which two or more, but not all light exit facets contained in the illumination unit are arranged. It is also possible that one or more optical elements of the imaging system are exposed to measuring light produced by all illumination members, and other (usually smaller) optical elements are exposed to measuring light produced by only some of the illumination members.

In some embodiments, the imaging subsystem has a magnification β with |β|=N·R, with N=2, 3, 4, . . . and R=$p_s/p_f$ being the ratio between an average pitch $p_s$ of adjacent measuring light spots on the optical surface and an average pitch $p_f$ of adjacent light exit facets. In this case the array of light exit facets is imaged on the optical surface such that the density of the spots illuminated on the optical surface is reduced by a factor 1/N. The imaging subsystems may be arranged such that spots not illuminated by one imaging subsystem are illuminated by another imaging subsystem, which results in a kind of interlaced illumination pattern. It is also possible to add additional imaging subsystems that can illuminate spots that can also be illuminated by illumination members of another imaging subsystem, thereby providing redundancy. This, in turn, improves the reliability of the measurement device in case of failure of light sources.

With such a magnification the illumination unit may be subdivided into n≥$N^2$ illumination subunits. Each illumination subunit then includes some of the illumination members whose light exit facets are arranged in the object plane of one of the imaging subunits. The illumination subunit may then be formed as an optical componentry including light sources, light concentrators and electrical circuitry, wherein such componentries can be replaced in case of failure, or can be added or removed from the illumination unit if the degree of redundancy shall be changed.

The object plane and the image plane of the optical system may be tilted with respect to one another, in particular in accordance with the Scheimpflug condition. This makes it possible to obliquely illuminate the optical surface which simplifies the arrangement of the detector unit. In certain embodiments, two optical elements of the optical system have axes of rotational symmetry that run parallel and spaced apart by a distance.

BRIEF DESCRIPTION OF THE DRAWINGS

Various features and advantages of the present disclosure may be more readily understood with reference to the following detailed description taken in conjunction with the accompanying drawings in which.

DESCRIPTION OF PREFERRED EMBODIMENTS

I. General Structure of Projection Exposure Apparatus

Figure 1:
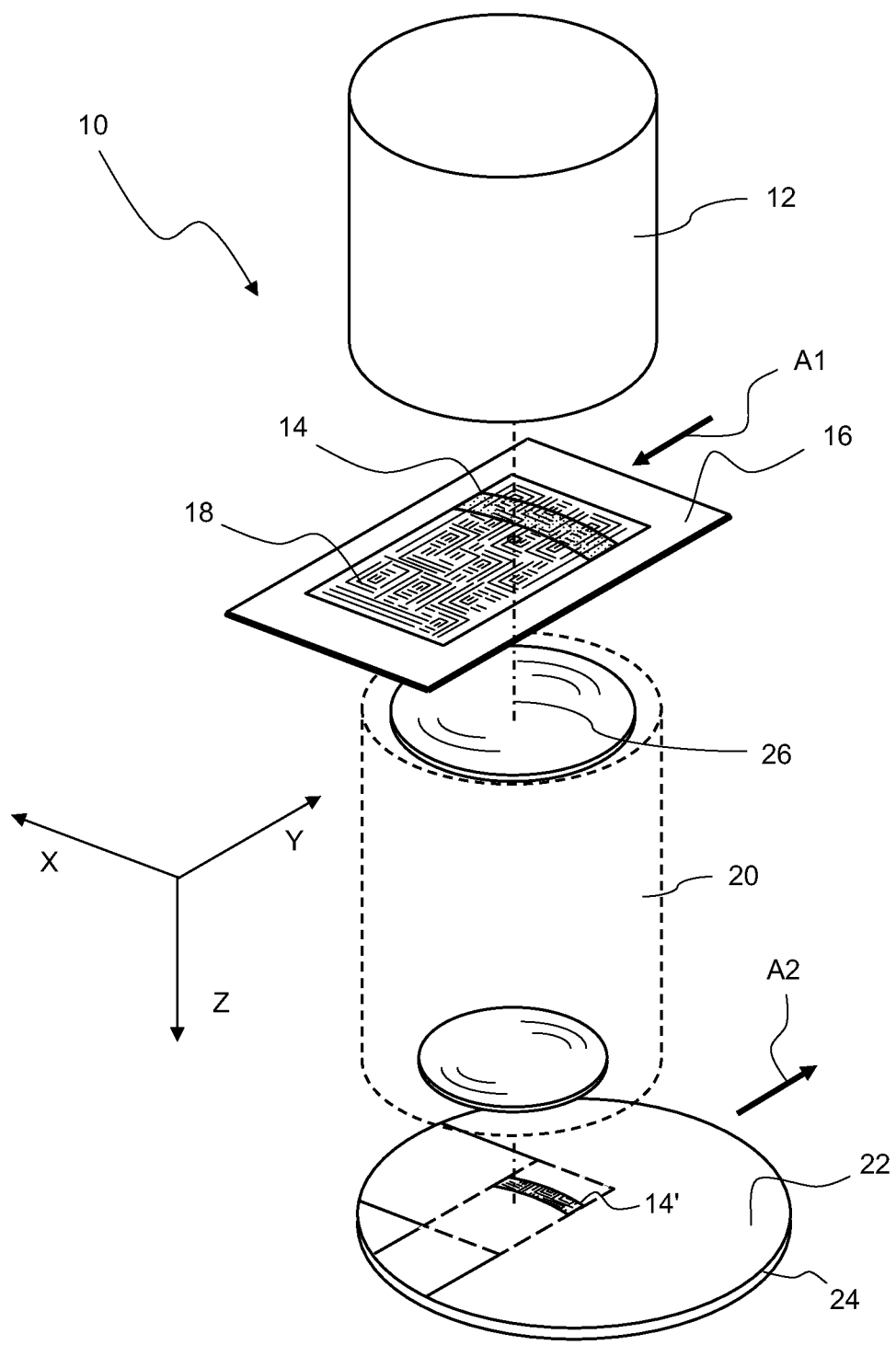
FIG. 1 is a perspective and considerably simplified view of a projection exposure apparatus in accordance with the present disclosure.

FIG. 1 is a perspective and highly simplified view of a DUV projection exposure apparatus 10 that includes an illumination system 12 for producing a projection light beam. The projection light beam illuminates a field 14 on a mask 16 containing minute structures 18. In this embodiment the illuminated field 14 has approximately the shape of a ring segment. However, other, for example rectangular, shapes of the illuminated field 14 are contemplated as well.

A projection objective 20 images the structures 18 within the illuminated field 14 onto a light sensitive layer 22, for example a photoresist, which is deposited on a substrate 24. The substrate 24, which may be formed by a silicon wafer, is arranged on a wafer stage (not shown) such that a top surface of the light sensitive layer 22 is precisely located in an image plane of the projection objective 20. The mask 16 is positioned by a mask stage (not shown) in an object plane of the projection objective 20. Since the latter has a magnification of less than 1, a minified image 14' of the structures 18 within the illuminated field 14 is projected onto the light sensitive layer 22.

During the projection, the mask 16 and the substrate 24 move along a scan direction which coincides with the Y direction. Thus the illuminated field 14 scans over the mask 16 so that structured areas larger than the illuminated field 14 can be continuously projected. Such a type of projection exposure apparatus is often referred to as "step-and-scan apparatus" or simply a "scanner". The ratio between the velocities of the mask 16 and the substrate 24 is equal to the inverse magnification of the projection objective 20. If the projection objective 20 inverts the image, the mask 16 and the substrate 24 move in opposite directions, as this is indicated in FIG. 1 by arrows A1 and A2. However, the present disclosure may also be used in stepper tools in which the mask 16 and the substrate 24 do not move during projection of the mask.

In the embodiment shown, the illuminated field 14 is not centered with respect to an optical axis 26 of the projection objective 20. Such an off-axis illuminated field 14 may be used with certain types of projection objectives 20. In other embodiments, the illuminated field 14 is centered with respect to the optical axis 26.

EUV projection exposure apparatus designed for projection light wavelengths below 20 nm, in particular for 13.6 nm, have the same basic structure. However, because there are no optical materials that transmit EUV radiation, only mirrors are used as optical elements, and also the mask is of the reflective type.

II. General Structure of Illumination System

Figure 2:
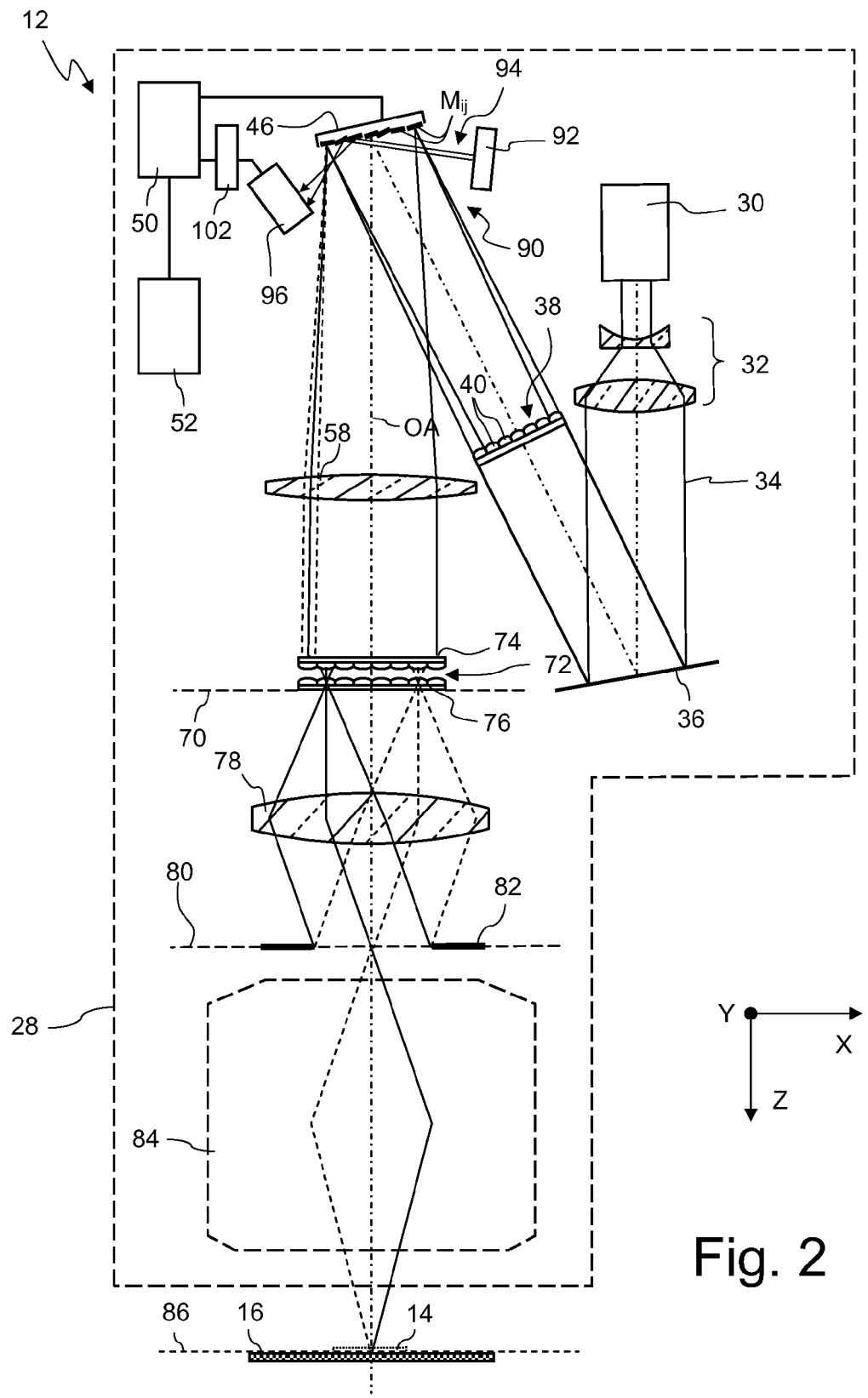
FIG. 2 is a meridional section through an illumination system contained in the projection exposure apparatus shown in FIG. 1.

FIG. 2 is a more detailed meridional section through the DUV illumination system 12 shown in FIG. 1. For the sake of clarity, the illustration of FIG. 2 is considerably simplified and not to scale. This particularly implies that different optical units are represented by very few optical elements only. In reality, these units may include significantly more lenses and other optical elements.

The illumination system 12 includes a housing 28 and a light source that is, in the embodiment shown, realized as an excimer laser 30. The excimer laser 30 emits projection light that has a wavelength of about 193 nm. Other types of light sources and other wavelengths, for example 248 nm or 157 nm, are also contemplated.

In the embodiment shown, the projection light emitted by the excimer laser 30 enters a beam expansion unit 32 in which the light beam is expanded without altering the geometrical optical flux. The beam expansion unit 32 may include several lenses as shown in FIG. 2, or may be realized as a mirror arrangement, for example. The projection light emerges from the beam expansion unit 32 as a substantially collimated beam 34. In other embodiments, this beam may have a significant divergence. The collimated beam 34 impinges on a plane folding mirror 36 provided for reducing the overall dimensions of the illumination system 12.

After reflection from the folding mirror 36, the beam 34 impinges on an array 38 of microlenses 40. A mirror array 46 is arranged in or in the vicinity to a back focal plane of the microlenses 40. As will be explained in more detail below, the mirror array 46 includes a plurality of small individual mirrors $M_{ij}$ that can be tilted, independently from each other, about two tilt axes that are preferably aligned perpendicularly to each other. The total number of mirrors $M_{ij}$ may exceed 100 or even several 1000. The reflecting surfaces of the mirrors $M_{ij}$ may be plane, but could also be curved, if an additional reflective power is desired. Apart from that, the mirror surfaces may support diffractive structures. In this embodiment the number of mirrors $M_{ij}$ is equal to the number of microlenses 40 contained in the microlens array 38. Thus each microlens 40 directs a converging light bundle on one mirror $M_{ij}$ of the mirror array 46.

The tilting movements of the individual mirrors $M_{ij}$ are controlled by a mirror control unit 50 which is connected to an overall system control 52 of the illumination system 12. Actuators that are used to set the desired tilt angles of the mirrors $M_{ij}$ receive control signals from the mirror control unit 50 such that each individual mirror $M_{ij}$ is capable of reflecting an impinging light ray by a reflection angle that is variable in response to the control signal. In the embodiment shown there is a continuous range of tilt angles at which the individual mirrors $M_{ij}$ can be arranged. In other embodiments, the actuators are configured such that only a limited number of discrete tilt angles can be set.

Figure 3:
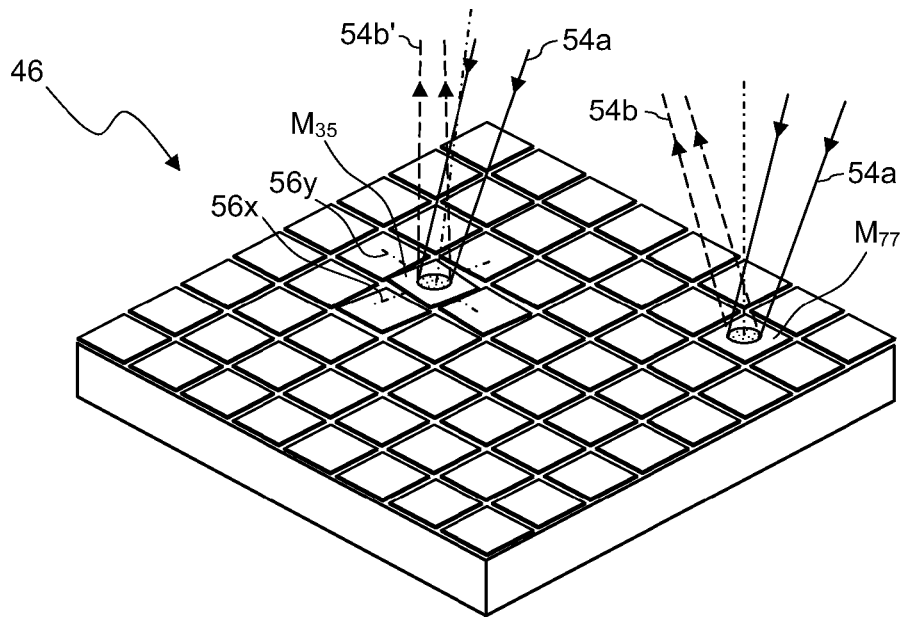
FIG. 3 is a perspective view of a mirror array contained in the illumination system of FIG. 2.

FIG. 3 is a perspective view of the mirror array 46 including, for the sake of simplicity, only 8·8=64 mirrors $M_{ij}$. Light bundles 54a impinging on the mirror array 46 are reflected to different directions depending on the tilt angles of the mirrors $M_{ij}$. In this schematic representation it is assumed that a particular mirror $M_{35}$ is tilted about two tilt axes 56x, 56y relative to another mirror $M_{77}$ so that the light bundles 54b, 54b' which are reflected by the mirrors $M_{35}$ and $M_{77}$, respectively, are reflected into different directions.

Referring again to FIG. 2, the light bundles reflected from the mirror $M_{ij}$ impinge on a first condenser 58 which ensures that the slightly diverging light bundles impinge, now as at least substantially parallel light bundles, on an optical integrator 72 which produces a plurality of secondary light sources. The optical integrator 72 increases the range of angles formed between the light rays and an optical axis OA of the illumination system 12. In other embodiments, the first condenser 58 is dispensed with so that the light bundles impinging on the optical integrator 72 have a larger divergence.

The optical integrator 72 is realized, in the embodiment shown, as a fly's eye lens including two substrates 74, 76 that each includes two orthogonal arrays of parallel cylindrical microlenses. Other configurations of the optical integrator are envisaged as well, for example integrators including an array of microlenses that have rotationally symmetrical surfaces, but rectangular boundaries. Reference is made to WO 2005/078522 A, US 2004/0036977 A1 and US 2005/0018294 A1, in which various types of optical integrators suitable for the illumination system 12 are described.

Reference numeral 70 denotes a system pupil surface of the illumination system 12 that substantially defines the angular distribution of the light impinging on the mask 14. The system pupil surface 70 is usually plane or slightly curved and is arranged in or in immediate vicinity to the optical integrator 72. As the angular light distribution in the system pupil surface 70 directly translates into an intensity distribution in a subsequent field plane, the optical integrator 72 substantially determines the basic geometry of the illuminated field 14 on the mask 16. Since the optical integrator 72 increases the range of angles considerably more in the X direction than in the scan direction Y, the illuminated field 14 has larger dimensions along the X direction than along the scan direction Y.

The projection light emerging from the secondary light sources produced by the optical integrator 72 enters a second condenser 78 that is represented in FIG. 2 by a single lens only for the sake of simplicity. The second condenser 78 ensures a Fourier relationship between the system pupil surface 70 and a subsequent intermediate field plane 80 in which a field stop 82 is arranged. The second condenser 78 superimposes the light bundles, which are produced by the secondary light sources, in the intermediate field plane 80, thereby achieving a very homogenous illumination of the intermediate field plane 80. The field stop 82 may include a plurality of movable blades and ensures sharp edges of the illuminated field 14 on the mask 16.

A field stop objective 84 provides optical conjugation between the intermediate field plane 80 and the mask plane 86 in which the mask 16 is arranged. The field stop 82 is thus sharply imaged by the field stop objective 84 onto the mask 16.

III. Measurement Device

The orientation of the mirrors, i.e. the tilting angles with regard to the tilt axes 56x, 56y (see FIG. 3), has to be controlled very accurately. This is because the pattern produced on the light sensitive surface 22 is very sensitive to variations of the intensity distribution in the system pupil plane 70, which depends on the orientation of the mirrors $M_{ij}$.

The orientation of the mirrors $M_{ij}$ can only be controlled accurately if it is possible to measure the orientation of the mirrors $M_{ij}$ individually. To this end the illumination system 12 includes a measurement device 90 which is configured to direct measuring light on each mirror $M_{ij}$ and to measure the direction of measuring light reflected therefrom.

In other embodiments the measuring device 90 is configured to not only measure the orientation of the mirrors $M_{ij}$, but also the shape of the reflecting surface of the mirrors $M_{ij}$. These shapes may change during operation of the projection exposure apparatus 10, usually as a result of heat caused by absorption of high energy projection light. In EUV illumination systems the issue of heat induced deformations is of particular concern because a larger fraction of projection light is absorbed by the mirrors as compared to DUV illumination systems. For measuring the shape of the individual mirrors $M_{ij}$, a surface related parameter (such as a surface normal or a distance) is obtained not only for one location on each mirror $M_{ij}$, but for a plurality of locations.

In either case the mirrors $M_{ij}$ may be considered as commonly forming a larger optical surface. The measuring device 90 then measures a certain parameter, which is related to this optical surface, at a plurality of locations on this optical surface. There are at least one, but possibly two or more, such locations on each mirror $M_{ij}$. The parameter may be, for example, a surface normal or, if there are three or more locations on a mirror $M_{ij}$, a distance. In this embodiment the parameter is suitable to describe the orientation of the mirrors $M_{ij}$ and thus the shape of the optical surface commonly formed by the mirrors $M_{ij}$.

The measurement device 90 feeds the measured parameter to the control unit 50. The latter may then readjust some or all mirrors $M_{ij}$ if the deviations between the measured mirror orientations and the target orientations exceed predetermined threshold values. More details regarding the control of the mirrors $M_{ij}$ can be gleaned from German patent application DE 10 2008 050 446.7 filed on Oct. 8, 2008 by the applicant and international patent application PCT/EP2008/010918 filed Dec. 19, 2008 by the applicant.

Figure 4:
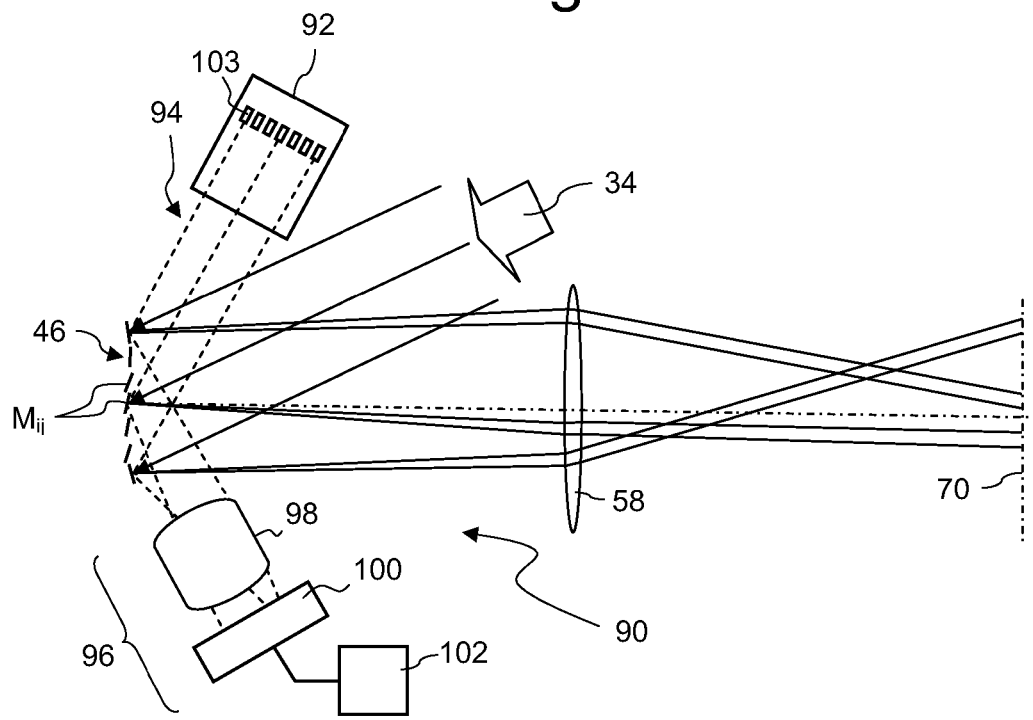
FIG. 4 is an enlarged cut-out of FIG. 2 showing a measurement device in accordance with the disclosure.

The general structure of the measurement device 90 will now be explained with reference to FIGS. 2 and 4 which is an enlarged and more detailed cutout therefrom:

The measurement device 90 includes an illumination unit 92 which directs to each mirror $M_{ij}$ an individual measuring light bundle 94. After reflection from the mirrors $M_{ij}$ the measuring light bundles 94 enter a detector unit 96 including detector optics 98 and a position resolving sensor 100. The detector optics 98 may include a condenser which translates the directions of the measuring light bundles 94 into positions on the position resolving sensor 100. The positional data obtained by the sensor 100 are supplied to an evaluation unit 102 which is configured to determine the orientation of the mirrors $M_{ij}$ on the basis of the directions of the reflected measuring light bundles 94 measured by the detector unit 96. These data are then fed to the control unit 50, as has been explained above. More details with regard to the detector unit 96 are described in the aforementioned WO 2008/095695 A1.

In order to be able to measure the orientation of each mirror $M_{ij}$ individually, the measurement device 92 identifies from which mirror $M_{ij}$ a detected measuring light bundle 94 has been reflected. One approach in this respect is to use an illumination unit 92 including a plurality of individual illumination members 103. Each member 103 produces a measuring light bundle 94 which is directed to one of the mirrors $M_{ij}$. Since the illumination members 103 can be controlled individually, it is possible to use optical multiplexing, for example in the time or frequency domain, to distinguish the measuring light bundles 94 detected by the sensor 100.

If the illumination unit 92 includes a plurality of individual illumination members 103, it is desirable to ensure that the light bundle 94 produced by each illumination member 103 impinges only on one mirror $M_{ij}$. In other words, the measuring light spots produced by the illumination members on the mirrors $M_{ij}$ are so small that they do not cover a significant area on any of the adjacent mirrors $M_{ij}$. Otherwise the measurement accuracy would be greatly reduced.

In this respect the aforementioned WO 2008/095695 A proposes to use individual optical imaging members for each illumination member. Each imaging member images a light exit facet of the illumination member onto the associated mirror $M_{ij}$. Each imaging member may be formed by a positive lens, and the plurality of lenses may form a microlens array.

However, it has turned out that as a result of preferred geometrical conditions (pitches of illumination members, pitches of mirrors and distance between illumination members and mirrors), diffraction significantly blurs the measuring light spots produced by the measuring light bundles 94 on the mirror $M_{ij}$. The spots are then not confined to one mirror $M_{ij}$, but partially cover one or more adjacent mirrors $M_{ij}$. This severely reduces the measurement accuracy that can be achieved with the measurement device 90.

1. First Embodiment

Figure 5:
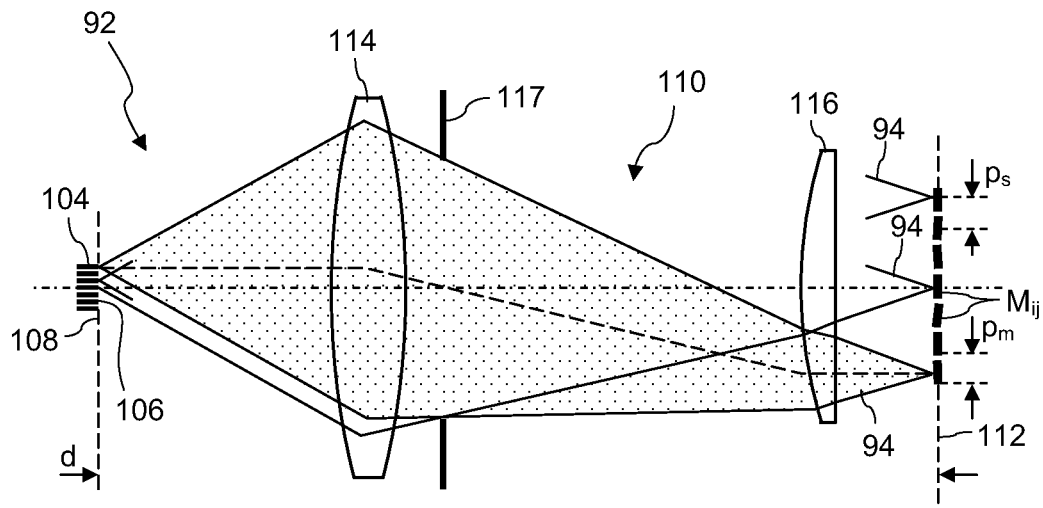
FIG. 5 is a meridional section through an illumination unit according to a first embodiment which may be used in the measurement device shown in FIG. 4.

FIG. 5 is a schematic meridional section through an illumination unit 92 according to a first embodiment. In this embodiment the illumination members are formed by light sources 104 that are arranged in a two dimensional array. The light sources 104 may be realized as laser diodes, for example Vertical Cavity Surface Emitting Lasers (VCSEL), which are particularly suitable for this application because these laser diodes can be densely packed, but can nevertheless be controlled individually. Each light source 104 has a light exit facet 106 which is arranged in an object plane 108 of an imaging system 110 which images the object plane 108 on an image plane 112.

In FIG. 5 the imaging system 110 is represented by two lenses 114, 116, only. However, it is to be understood that other, and in particular more complex, imaging systems 110 may be used for imaging the object plane 108 on the image plane 112. The imaging system 110 may be particularly corrected for telecentricity errors because the directions under which the measuring light bundles 94 impinge on the mirrors $M_{ij}$ are crucial for the measurement accuracy and therefore have to be exactly known. Furthermore, the imaging system 110 may include adjustable optical elements, for example lenses or mirrors that can be moved along an optical axis or perpendicular thereto with the help of manipulators. Adjustments of optical elements may be used to commonly vary the size and/or the location of the measuring light spots produced on the mirrors $M_{ij}$.

Since the light sources 104 are not imaged on the mirrors $M_{ij}$ by individual microlenses but by the common imaging system 110, the diameters of the optical elements of the imaging system 110 will generally be much larger. Consequently, the measuring light spots, i.e. the images of the light exit facets 106 produced on the mirrors $M_{ij}$, are not significantly blurred as a result of diffraction. Arranging the light exit facets 106 in the object plane 108 of the common imaging system 110 therefore makes it possible to completely confine a measuring light spot to the surface of one individual mirror $M_{ij}$. The measurement accuracy is therefore not reduced as a result of measuring light directed to wrong mirrors $M_{ij}$.

The advantages associated with imaging more than one light exit facet 106 with the imaging system 110 are particularly significant if the inequation $$p_s^2 < 5\lambda d \quad (1)$$

is fulfilled. Here $p_s$ is an average pitch of the measuring light spots produced on the optical surface. If the optical surface is formed by mirrors $M_{ij}$, this pitch $p_s$ will usually be equal to the pitch $p_m$ of the mirrors $M_{ij}$. In the above inequation d denotes the distance between the object plane 108 and the image plane 112, and $\lambda$ is a center wavelength of the measuring light. If inequation (1) is fulfilled, diffraction would, when each light exit facet was imaged by its own lens on a mirror $M_{ij}$, blur the light spots produced on the mirrors $M_{ij}$ to an extent resulting in a significant reduction of the measurement accuracy.

An exchangeable or adjustable aperture stop 117 may be used to vary the numerical aperture of the measuring light bundles 94 producing the spots on the mirrors $M_{ij}$. A uniform numerical aperture of the measuring light bundles 94 facilitates the design of the detector unit 96.

2. Second Embodiment

Light sources 104 having small light exit facets 106 inevitably produce measuring light bundles 94 having a large divergence. This results in a large geometrical optical flux which makes the optical design of the imaging system 110 more difficult and usually implies the use of optical elements having a large diameter.

Figure 6:
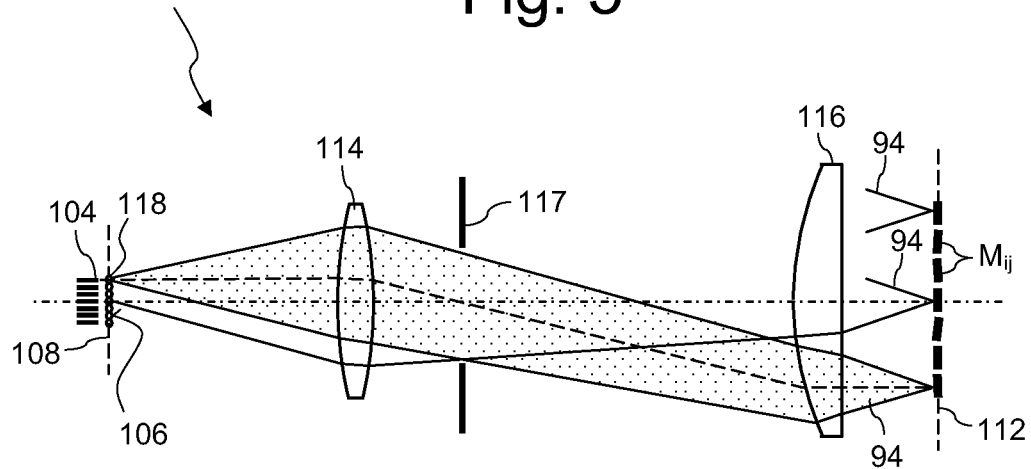
FIG. 6 is a meridional section through an illumination unit according to a second embodiment which may be used in the measurement device shown in FIG. 4, wherein illumination members include light concentrators.

FIG. 6 shows, in a representation similar to FIG. 5, an illumination unit 92 according to a second embodiment in which each illumination member 103 includes, in addition to the light source 104 producing measuring light, a light concentrator 118 that may be formed by a microlens having a positive refractive power. The microlenses forming the light concentrators 118 may be arranged so as to form a microlens array positioned immediately in front of the light sources 104. Such microlenses may also be applied directly on front facets of laser diodes forming the light sources 104.

Figure 7:
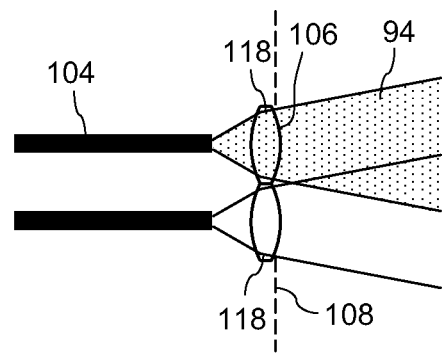
FIG. 7 is an enlarged cutout of FIG. 6 showing two illumination members.

As is illustrated in the enlarged cutout in FIG. 7, the light concentrators 118 reduce the divergence of the light bundles 94 emitted by the light sources 104 and thereby reduce the geometrical optical flux the optical system 110 has to cope with. This facilitates the design of the imaging system 110 and usually makes it possible to use optical elements having a smaller diameter (see lens 114 in FIG. 6 compared to lens 114 in FIG. 5). The light concentrators 118 are configured such that diffraction produced by the light concentrators 118 will not result in a substantial blurring of the light spots produced on the mirrors $M_{ij}$.

In the embodiment shown in FIG. 6 the light exit facets 106 are now formed by the back surfaces of the light concentrators 118 which are arranged in the object plane 108 of the imaging system 110. The imaging system 110 thus images a surface, which is formed by these back surfaces and which emits light bundles with a decreased divergence, as compared to the embodiment shown in FIG. 5.

3. Third Embodiment

Figure 8:
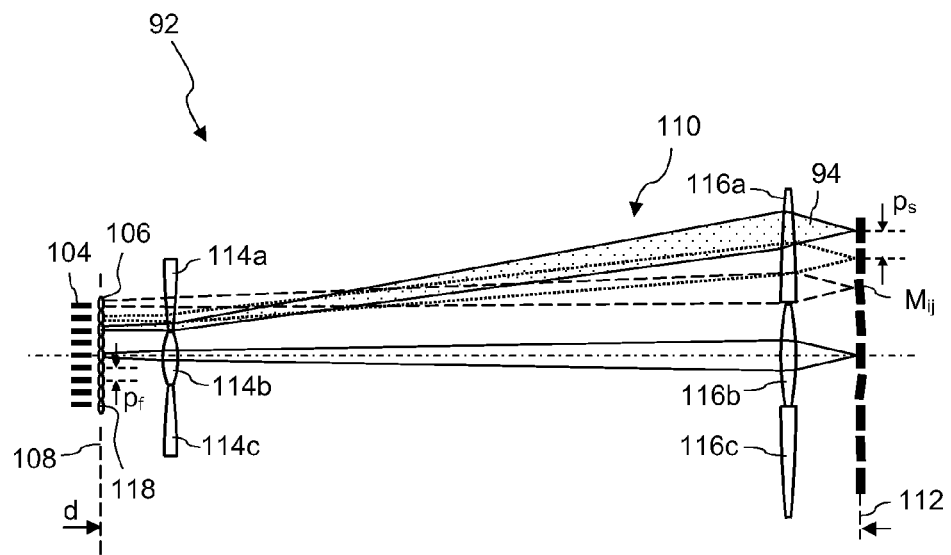
FIG. 8 is a meridional section through an illumination unit according to a third embodiment which may be used in the measurement device shown in FIG. 4, wherein an imaging system includes three imaging subsystems.

FIG. 8 is a meridional section through an illumination unit 92 according to a third embodiment. In contrast to the second embodiment shown in FIGS. 6 and 7, the imaging system 110 includes a plurality of imaging subsystems each having an object plane in which more than two, but not all light exit facets 106 are arranged. In the embodiment shown there are three imaging subsystem each including two positive lenses 114a, 116a, 114b, 116b and 114c, 116c, respectively.

In order to prevent measuring light spots from extending to adjacent mirrors $M_{ij}$ as a result of diffraction, condition (2) should be fulfilled:

$$Mp_s^2 \geq 5\lambda d \quad (2)$$

Here M>2 is the factor by which the minimum diameter of an imaging subsystem exceeds the pitch $p_s$ of the light spots (i.e. the minimum diameter is $Mp_s$).

4. Fourth Embodiment

Figure 9:
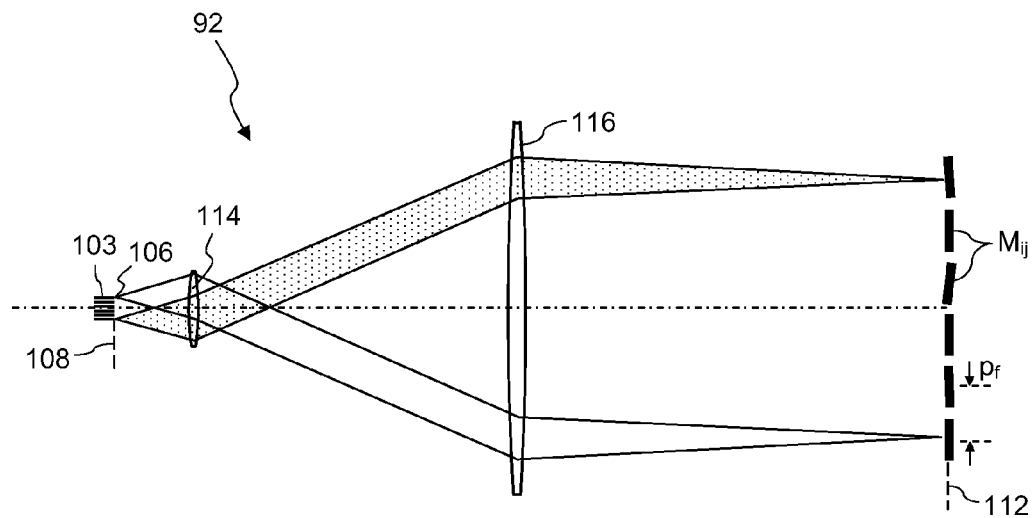
FIG. 9 is a meridional section through an illumination unit according to a fourth embodiment which may be used in the measurement device shown in FIG. 4, wherein the distance between the imaging system and the mirror array is particularly large.

FIG. 9 is a meridional section through an illumination unit 92 according to a fourth embodiment which is similar to the first embodiment shown in FIG. 5. However, in this embodiment the imaging system 110 is configured such that the distance between the second lens 116 and the image plane 112 is larger. This simplifies the spatial arrangement of the measurement device 90 in the illumination system 12. Furthermore, the numerical aperture of the measuring light bundles 34 is reduced as compared to the embodiment shown in FIG. 5. This facilitates the design and arrangement of the detector optics 98. The illumination members 103 may again include light sources or combinations of light sources and light concentrators.

5. Fifth Embodiment

In all aforementioned embodiments the imaging system 110 has a magnification β which is given by $$|\beta|=R=p_s/p_f \quad (3)$$

with $p_s$ being again the average pitch of the measuring light spots mirrors $M_{ij}$ in the image plane 112 and $p_f$ being the average pitch of the light exit facets 106 in the object plane 104 (see FIG. 8).

Figure 10:
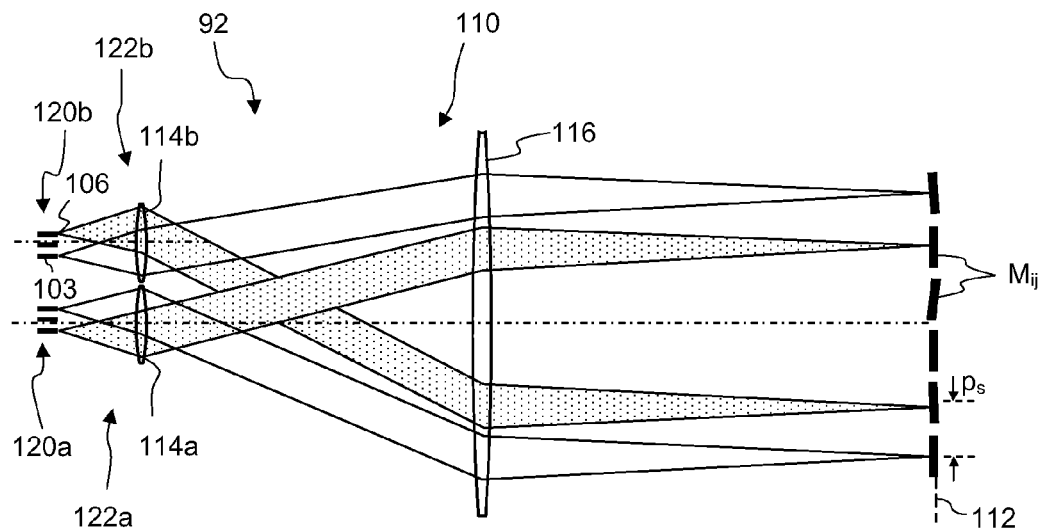
FIG. 10 is a meridional section through an illumination unit according to a fifth embodiment which may be used in the measurement device shown in FIG. 4, wherein the magnification has been set differently.

FIG. 10 is a meridional section through an illumination unit 92 according to a fifth embodiment in which the magnification β is set differently. A first illumination subunit 122a includes a first array 120a including three illumination members 103 and an optical subsystem including positive lens 114a and lens 116. A second illumination subunit 122b includes a second array 120b including three illumination members 103 and an optical subsystem including positive lens 114b and lens 116. The lens 116 is thus part of both illumination subsystems 122a, 122b.

In each illumination subsystem 122a, 122b the magnification β of the optical subsystem is given by $$|\beta|=2 \cdot R=2 \cdot ps/pf \quad (4)$$

As a result, adjacent illumination members 103 do not produce measuring light spots on adjacent mirrors $M_{ij}$, but on mirrors which are separated by one mirror in between. If, in the general case, the magnification β fulfills $$|\beta|=N \cdot p_s/p_f \quad (5)$$

adjacent illumination members 103 do not produce measuring light spots on adjacent mirrors $M_{ij}$, but on mirrors which are separated by N−1 mirrors in between along a given direction.

In the illumination unit 92 shown in FIG. 10 the first and second arrays 120a, 120b are arranged with respect to the lenses 114a and 114b, respectively, such that the mirrors $M_{ij}$ not illuminated by the first array 120a are illuminated by the second array 120b, and vice versa. Thus measuring light spots can be produced on all mirrors $M_{ij}$ of the array 46. If the spatial relationship between one of the arrays 120a, 120b with respect to the corresponding lens 114a and 114b, respectively, is suitably changed, for example by slightly displacing one array or the corresponding lens perpendicularly to the optical axis, it is possible to produce two overlapping measuring light spots on every second mirror $M_{ij}$.

Figure 11:
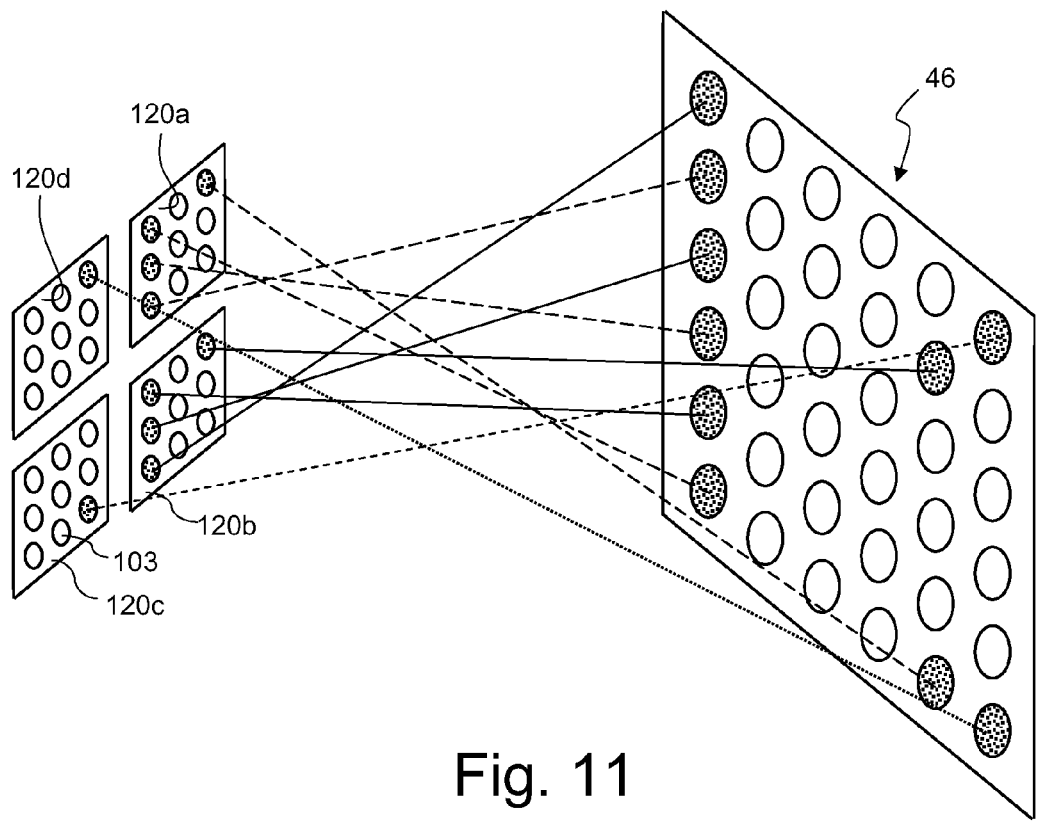
FIG. 11 is a schematic representation illustrating the three-dimensional arrangement of arrays of illumination members.

The advantages associated with a magnification fulfilling equation (5) will become more apparent from FIG. 11 which illustrates schematically the three-dimensional arrangement of the arrays of illumination members 103 of this embodiment. The illumination members 103 form four two-dimensional 3×3 arrays 120a, 120b, 120c and 120d. On the right hand side of FIG. 11 locations on the mirror array 46, on which measuring light spots can be produced by the illumination members 103, are indicated as circles. Darker areas illustrate the presence of measuring light, and lines connecting light emitting illumination members 103 with locations indicate the spatial relationship, i.e. which light emitting illumination member 103 illuminates which location on the mirror array 46. For the sake of simplicity the optical subsystems imaging the light exit facets of the illumination members 103 on the mirror array 46 are not shown.

As becomes clear from FIG. 11, the arrays 120a to 120d may be spaced apart by a distance much larger than the pitch $p_f$ between light exit facets of the illumination members 103. The relative arrangement between the arrays 120a to 120b on the one hand and the optical subsystems provided to image the arrays 120a to 120b on the mirror array 46 determine where measuring light spots can be produced on the mirror array 46.

Generally, if a mirror array includes m×m mirrors $M_{ij}$ and the magnification is β=N·R, n=$N^2$ subunits each including (m/N)×(m/N) illumination members have to be provided in the case of zero redundancy.

This concept has the following advantages:

a) Array Size Reduction

Since the distance between adjacent arrays 120a to 120d may be much larger than the pitch $p_f$ between adjacent illumination members 103, the arrays 120a to 120d may be produced as separate units, for example as separate dies on which a plurality of laser diodes are formed. In the simplified embodiment shown in FIGS. 10 and 11, these arrays include only 3×3=9 illumination members 103, whereas the mirror array 46 includes 36 mirrors $M_{ij}$. The production of smaller arrays of illumination members 103 is simpler and usually results in higher production yields. Furthermore, in case of failure of an illumination member 103, replacement of only one (small) array which includes the failed illumination member is involved. In the embodiments described before, the entire array of light sources has to be replaced, because it is usually not possible to replace single light sources in a densely packed array.

b) Redundancy

Another advantage is that the positions of the spots produced by the arrays 120a to 120d can be easily adjusted by carefully changing the spatial relationship between the arrays 120a to 120d with respect to the lenses 114a to 114d. This also includes the ability to provide redundancy so that a location on the mirror array 46 can be illuminated by illumination members 103 of different arrays 120a to 120d.

Figure 12:
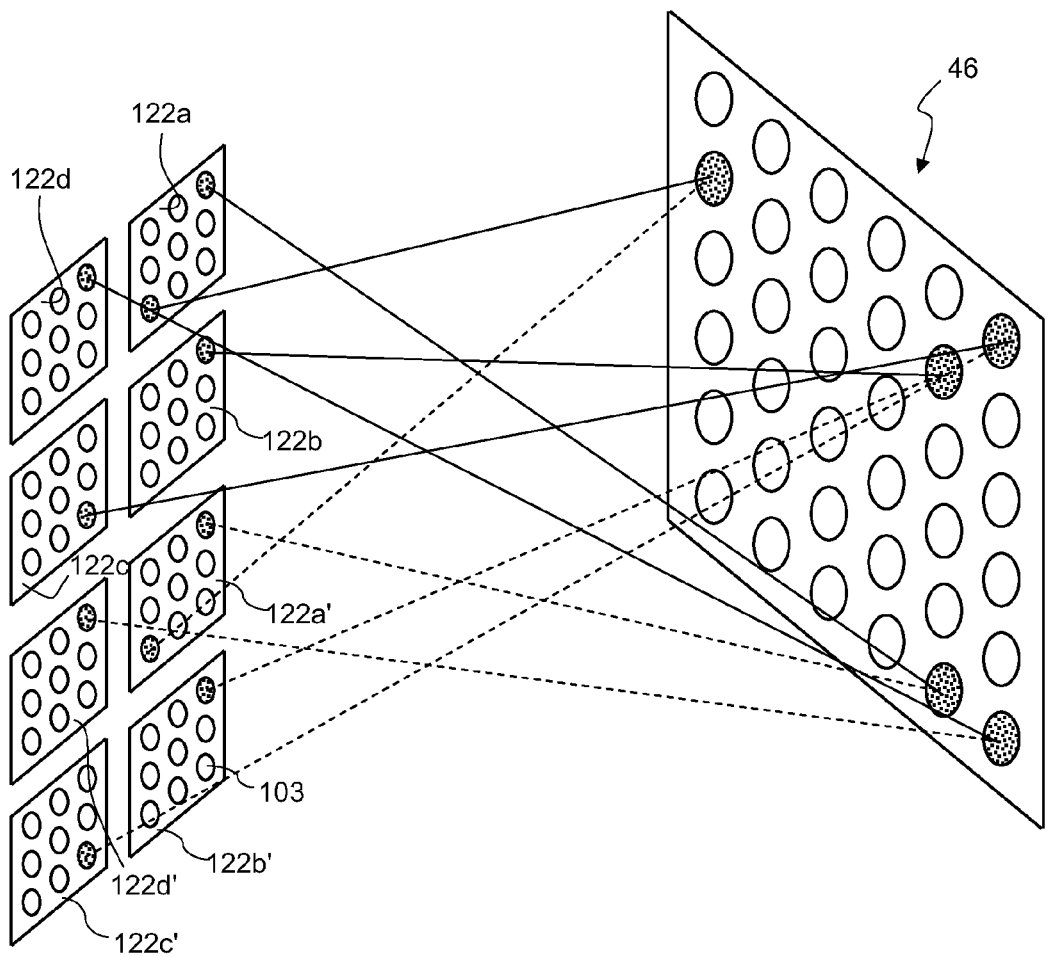
FIG. 12 is a schematic representation similar to FIG. 11 for an alternative embodiment.

This is schematically illustrated in FIG. 12 in which two sets of illumination member arrays 122a to 122b and 122a' to 122b' are provided. Each of the locations on the mirror array 46 indicated by circles can be illuminated by two illumination members 103, wherein one illumination member 103 is arranged in one of the arrays 122a to 122b and the other illumination member 103 is arranged in one of the other arrays 122a' to 122b'.

This concept even makes it possible to add additional illumination subunits after the projection exposure apparatus 10 has been put into operation. Such a situation may occur, for example, if it turns out that the lifetime of the illumination members 103 is shorter than expected. The degree of redundancy of illumination members 103 can then be easily increased by adding additional arrays of illumination members to the measurement device 90.

6. Sixth Embodiment

In the embodiments described above it has been assumed that the mirror array 46 can be arranged at least substantially perpendicular to an optical axis of the imaging system 110. In real systems the mirror array 46 should be illuminated obliquely, because only then it can be ensured that no components of the measuring device 90 interrupt the propagation of the projection light, and that the measuring light bundles 94 reflected from the mirrors $M_{ij}$ can be received by detector optics 98 (see FIG. 4). If the object plane 106 and the image plane 112 of the imaging system 110 fulfill the Scheimpflug condition, such an oblique illumination can be easily achieved.

Figure 13:
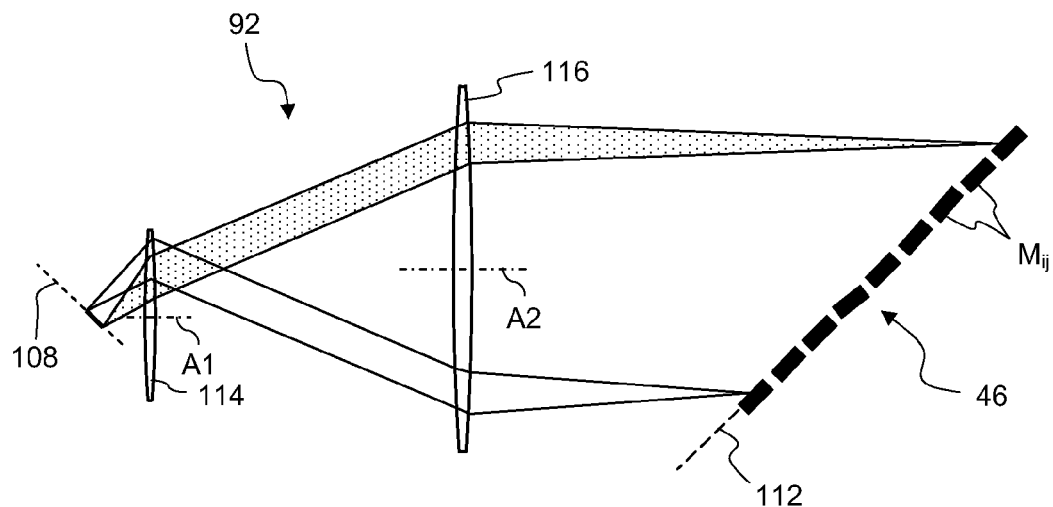
FIG. 13 is a meridional section through an illumination unit according to a sixth embodiment which may be used in the measurement device shown in FIG. 4, wherein the object plane is inclined with respect to the image plane.

FIG. 13 illustrates an illumination unit 92 which is similar to the illumination unit shown in FIG. 9. However, in this embodiment the Scheimpflug condition is fulfilled so that a good imaging quality is achieved although the object plane 106 is arranged obliquely with regard to the image plane 112 in which the mirror array 46 is arranged. Furthermore, the lenses 114, 116 have axes A1 and A2, respectively, of rotational symmetry that are not collinear, but run parallel and spaced apart by a distance.

7. Seventh Embodiment

Figure 14:
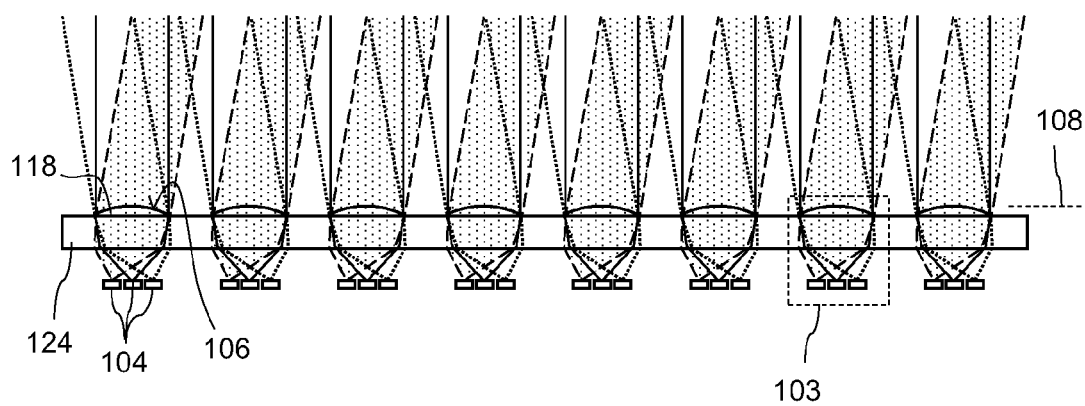
FIG. 14 is a meridional section through a plurality of illumination members according to a seventh embodiment.

An approach of providing redundancy of light sources 104 within the illumination members 103 is illustrated in FIG. 14 which is a meridional section through a plurality of illumination members 103. Each illumination member 103 includes an array of light sources 104 and one light concentrator. The light concentrator is formed by a lens 118 applied on a substrate 124 which is common to all illumination members 103. In some embodiments, only one of the light sources 104 of an illumination member 103 is operating at a given time.

The light exit facet 106, which is arranged in the object plane 108, is not formed by the light sources 104, but by the back surface of the light concentrator lenses 118. It is possible to arrange the light sources 104 such that the size and position of the light exit facet 106 does not depend on which one of the light sources 104 of the illumination member 103 is currently producing measuring light. If one of the light sources 104 of an illumination member 103 fails, the control of the light sources 104 ensures that one of the other light sources 104 of this illumination member 103 takes over. Since the light exit facet 106 is fixed, this will not change the spot position or size produced on the mirror $M_{ij}$, but will only have an effect on the direction under which the measuring light bundle 94 impinges on the mirror $M_{ij}$. This can be taken into account by the evaluation unit 102 when determining the mirror orientation.

8. Eighth Embodiment

Figure 15:
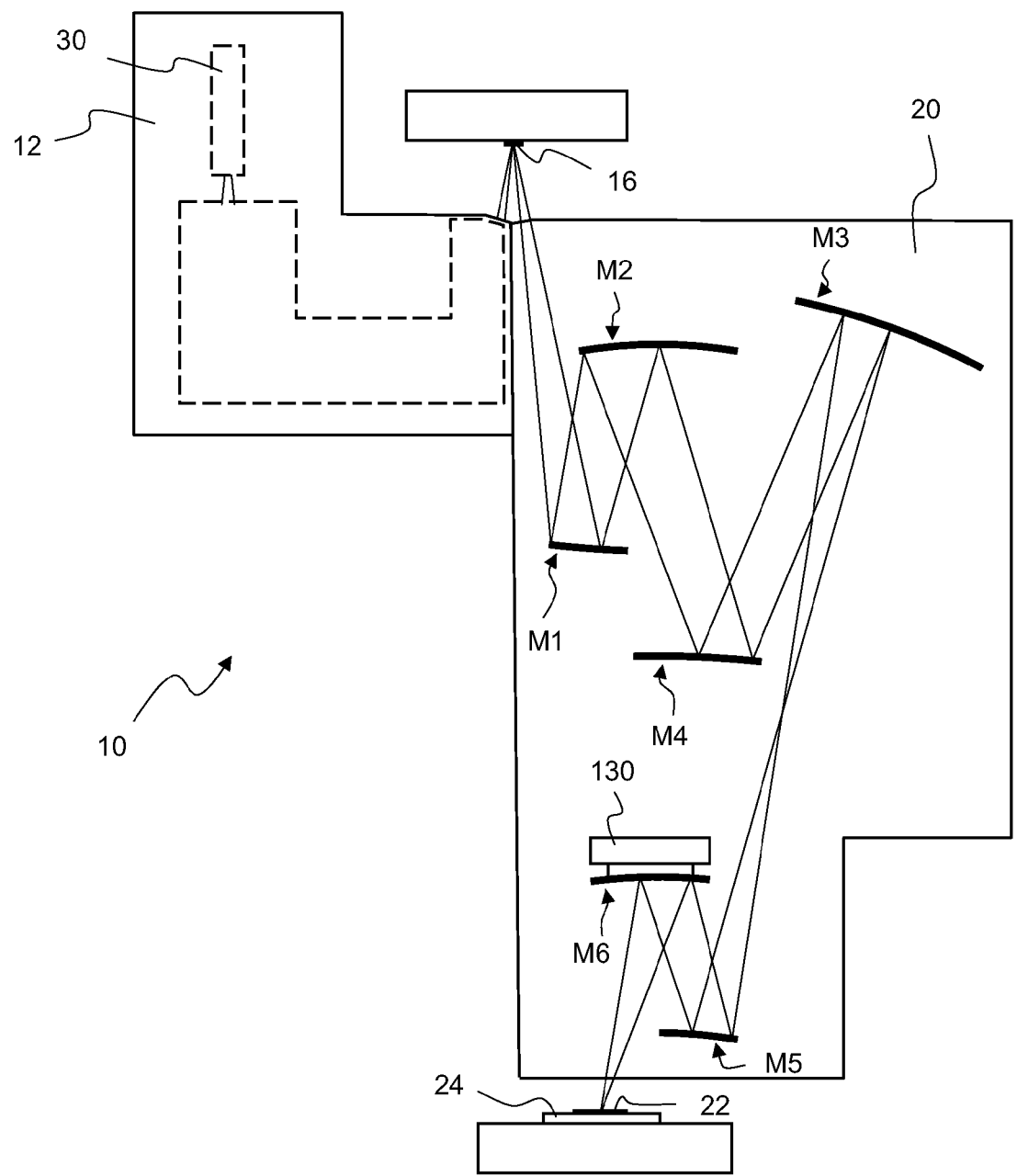
FIG. 15 is a schematic illustration of an EUV projection exposure apparatus including according to an eighth embodiment.

FIG. 15 is a schematic illustration of an EUV projection exposure apparatus including an illumination system 12 with a EUV radiation source 30, a reflective mask 16 and a projection objective 20. The objective 20 includes six mirrors M1 to M6, which form a reduced image of the mask 16 on a light sensitive surface 22 applied on a support 24.

In the embodiment shown the last mirror M6 is an adaptive mirror. To this end an actuator unit 130 is provided that is configured to deform the reflective surface of the mirror M6. The deformation is determined such that aberrations are reduced. This is particularly useful if the aberrations are time varying. Such time varying aberrations are often caused by variations of the temperature distribution of the mirrors M1 to M6, as they may occur after the mask 16 or the illumination setting produced by the illumination system 12 has been changed.

Figure 16:
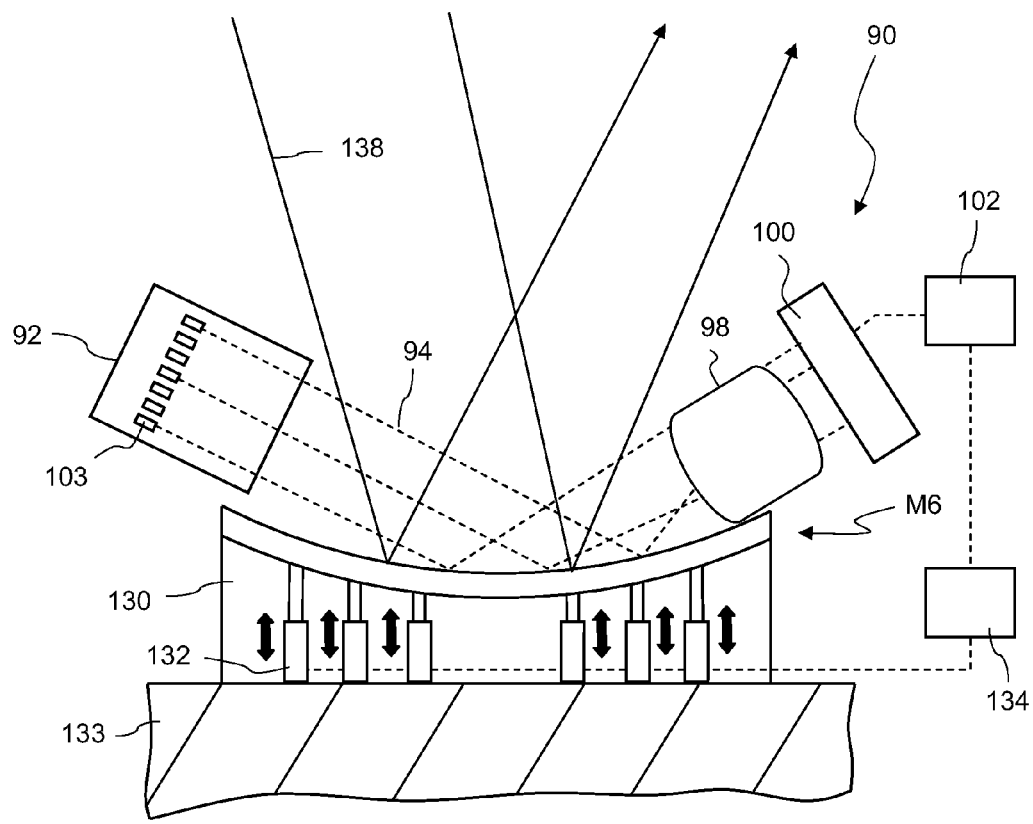
FIG. 16 is an enlarged and more detailed cutout of FIG. 15.

FIG. 16 is a schematic and more detailed side view of the mirror M6 and the actuator unit 130. The actuator unit 130 includes a plurality of actuators 132 that are fixed to a common support structure 133 and are configured to exert forces on the mirror M6, as it is indicated in FIG. 16 by double arrows. The actuators 132 are controlled by an actuator control unit 134 which controls the actuators 132 such that a desired surface deformation is achieved.

To this end the projection objective 20 includes substantially the same measurement device 90 as it has been explained above with reference to FIG. 4 to 14. The illumination unit 92 including a plurality of illumination members 103 which direct measuring light bundles 94 towards selected locations on the optical surface of the mirror M6. The reflected measuring light bundles enter the detector optics 98 of the detector unit 96 and are then detected by the sensor 100. The arrangement of the illumination unit 92 and the detector unit 96 is determined such that it does not interfere with the EUV projection light 138.

The evaluation unit 102 connected to the sensor 100 determines the shape of the mirror M6 on the basis of the directions of light bundles as measured by the detector unit 96. The surface shape information obtained by the measurement device 90 is used to control the actuators 132 in a closed-loop control scheme.

The above description of the preferred embodiments has been given by way of example. From the disclosure given, those skilled in the art will not only understand the present disclosure and its attendant advantages, but will also find apparent various changes and modifications to the structures and methods disclosed. The applicant seeks, therefore, to cover all such changes and modifications as fall within the spirit and scope of the disclosure, as defined by the appended claims, and equivalents thereof.

What is claimed is:

1. A projection exposure apparatus configured to image an object in a first object plane into a first image plane, comprising:
   an optical surface; and
   a measurement device configured to measure a parameter related to the optical surface at a plurality of locations on the optical surface, the measurement device comprising an illumination unit, the illumination unit comprising:
      a plurality of illumination members, each illumination member having a light exit facet configured to emit measuring light during use; and
      an optical imaging system configured to establish an imaging relationship between a second object plane and a second image plane, at least two light exit facets being arranged in the second object plane, and the second image plane at least substantially coinciding with the optical surface so that, during use of the measurement device, a plurality of measuring light spots are produced on the optical surface, the plurality of lights spots being images of the at least two light exit facets,
   wherein the second object plane is different from the first object plane, the second image plane is different from the first image plane, and the projection exposure apparatus is a microlithographic projection exposure apparatus configured so that, during use of the microlithographic projection exposure apparatus, a mask is the object in the first object plane.

2. The projection exposure apparatus of claim 1, wherein the measurement device further comprises a detector unit configured to measure a property of measuring light after the measuring light interacts with the optical surface at the measuring light spots.

3. The projection exposure apparatus of claim 2, wherein the measurement device further comprises an evaluation unit configured to determine the surface related parameter for each of the locations on the basis of the properties of the measuring light determined by the detector unit.

4. The projection exposure apparatus of claim 3, wherein the parameter related to the optical surface and measured at a plurality of locations defines the shape of the optical surface.

5. The projection exposure apparatus of claim 1, further comprising a unit configured to deform the optical surface.

6. The projection exposure apparatus of claim 1, wherein the optical surface is configured to reflect at least a substantial portion of the measuring light.

7. The projection exposure apparatus of claim 1, wherein the optical surface comprises an array of mirrors configured to reflect an impinging light ray by a variable reflection angle.

8. The projection exposure apparatus of claim 7, wherein the mirrors are tiltable about at least one axis.

9. The projection exposure apparatus of claim 7, wherein the projection exposure apparatus comprises an illumination system, the array of mirrors is arranged in the illumination system, and the mirrors are configured to direct projection light towards a pupil surface of the illumination system.

10. The projection exposure apparatus of claim 1, wherein the condition $p_s^2 < 5\lambda d$ holds, d is an average distance between the light exit facets and the optical surface, $p_s$ is an average pitch of the light spots produced on the optical surface, and $\lambda$ is a center wavelength of the measuring light.

11. The projection exposure apparatus of claim 1, wherein at least one illumination member comprises:
   a measuring light source configured to produce the measuring light; and
   a light concentrator in an optical path of the measuring light so that the light concentrator reduces a divergence of the measuring light produced by the measuring light source.

12. The projection exposure apparatus of claim 1, wherein at least one illumination member comprises at least two measuring light sources configured to direct measuring light to the same light spot on the optical surface.

13. The projection exposure apparatus of claim 11, wherein the at least two measuring light sources are in a back focal plane of the light concentrator.

14. The projection exposure apparatus of claim 1, wherein the optical imaging system comprises at least two optical imaging subsystems, each optical imaging subsystem having an object plane in which two or more light exit facets are arranged, and wherein at least one light exit facet in the illumination unit is not arranged in any of the object planes of the optical imaging subsystems.

15. The projection exposure apparatus of claim 14, wherein:
   the optical imaging subsystems have a magnification $\beta$;

$|\beta| = N \cdot R;$ $N = 2, 3, 4, \ldots;$ $R = p_s/p_f$ $p_s$ is an average pitch of the light spots produced on the optical surface; and
   $p_f$ is an average pitch of adjacent light exit facets.

16. The projection exposure apparatus of claim 15, wherein the illumination unit is subdivided into $n \geq N^2$ illumination subunits, and each illumination subunit comprises some of the illumination members whose light exit facets are arranged in the object plane of one of the imaging subunits.

17. The projection exposure apparatus of claim 1, wherein the second object plane and the second image plane are tilted with respect to one each other.

18. The projection exposure apparatus of claim 1, further comprising a projection objective configured so that, during use of the projection exposure apparatus, the projection objective images the mask in the first object plane into the first image plane.

19. A method, comprising:
   providing the projection exposure apparatus of claim 1; and
   using the projection exposure apparatus in the manufacture of a microstructured component.

20. An illumination system configured to illuminate a first object plane, comprising:
   an optical surface; and
   a measurement device configured to measure a parameter related to the optical surface at a plurality of locations on the optical surface, the measurement device comprising an illumination unit, the illumination unit comprising:
      a plurality of illumination members, each illumination member having a light exit facet configured to emit measuring light during use; and
      an optical imaging system configured to establish an imaging relationship between second object plane and an image plane, at least two light exit facets being arranged in the second object plane, and the image plane at least substantially coinciding with the optical surface so that, during use of the measurement device, a plurality of measuring light spots are produced on the optical surface, the plurality of lights spots being images of the at least two light exit facets,
   wherein the first object plane is different from the second object plane, and the illumination system is a microlithographic illumination system configured so that, during use of the microlithographic illumination system, a mask is present in the first object plane.

21. The projection exposure apparatus of claim 17, further comprising an illumination system configured so that, during use of the projection exposure apparatus, the illumination system illuminates the mask in the first object plane.

22. A projection exposure apparatus, comprising:
   an illumination system comprising an optical surface, the illumination system configured so that, during use of the projection exposure apparatus, the illumination system illuminates a mask;
   a projection objective configured so that, during use of the projection exposure apparatus, the projection objective images the mask onto a light sensitive layer; and
   a measurement device configured to measure a parameter related to the optical surface at a plurality of locations on the optical surface, the measurement device comprising an illumination unit, the illumination unit comprising:
      a plurality of illumination members, each illumination member having a light exit facet configured so that, during use of the projection exposure apparatus, each light exit facet emits measuring light; and
      an optical imaging system configured so that, during use of the projection exposure apparatus, the optical imaging system establishes an imaging relationship between an object plane and an image plane, at least two light exit facets being arranged in the object plane, and the image plane at least substantially coinciding with the optical surface so that, during use of the measurement device, a plurality of measuring light spots are produced on the optical surface, the plurality of lights spots being images of the at least two light exit facets,
   wherein the projection exposure apparatus is a microlithography projection exposure apparatus.

* * * * *